United States Patent [19]

El-Hamamsy et al.

[11] Patent Number: 5,861,838

[45] Date of Patent: Jan. 19, 1999

[54] SOLDERLESS 'FINGERPRINT' RF SHIELD

[75] Inventors: Sayed-Amr Ahnes El-Hamamsy, Schenectady, N.Y.; Perry Scott Frederick, Waukesha, Wis.; Roman Ihor Dachniwskyj, Pewaukee, Wis.

[73] Assignee: General Electric Company, Schenectady, N.Y.

[21] Appl. No.: 987,744

[22] Filed: Dec. 9, 1997

[51] Int. Cl.[6] ........................................... G01V 3/00
[52] U.S. Cl. ............................... 324/318; 324/322
[58] Field of Search ................................ 324/318, 322, 324/300, 306, 307, 309; 128/653.5

[56] References Cited

U.S. PATENT DOCUMENTS

| | | | |
|---|---|---|---|
| 5,572,131 | 11/1996 | Rzedzian | 324/318 |
| 5,574,373 | 11/1996 | Pausch et al. | 324/318 |
| 5,642,049 | 6/1997 | Harada et al. | 324/318 |
| 5,680,046 | 10/1997 | Frederick et al. | 324/318 |

*Primary Examiner*—Louis Arana
*Attorney, Agent, or Firm*—Lawrence P. Zale; Marvin Snyder

[57] ABSTRACT

Several complete fingerprint coils are attached to a support. The support is then rolled into a cylindrical shape such that a ray connecting the centers of each of pair of coils aligns with a component of a magnetic desired to be minimized or eliminated. In order to create this alignment, the support must have a length larger than the circumference of the cylinder which it forms, thereby causing a predetermined overlap. Since the coils are complete, there is no need to solder half-turns of coils to make a complete coil as was the case in previous coils. Since there are no solder points which are typically weaker than the remaining coil, the coil assembly is more resilient and less prone to breakage, making it more reliable.

6 Claims, 3 Drawing Sheets

SOLDERLESS 'FINGERPRINT' RF SHIELD

BACKGROUND OF THE INVENTION

1. Field of the Invention

This invention relates to design and manufacture of coil assemblies for magnetic resonance imaging.

2. Discussion of Prior Art

In designing coils, such as whole-body RF coils for creating MR images of a subject, it is highly desirable to reduce the stray RF fields produced outside of an area of interest. These stray RF fields create magnetic fields which cause interference in other electrical equipment, may induce eddy currents in nearby conductive materials, and may affect the data acquired.

One such way of reducing these fields is to use shielding, such as a passive RF shield. In MR imaging an RF transmitter coil typically has cylindrical shape encompassing a portion of the subject desired to be imaged with a Z axis passing through the length of the coil. For sake of clarification, the mathematical definition of "cylinder" will be employed throughout the remainder of the specification. This defines a cylinder to be a surface drawn by a line rotating parallel to a fixed center line and tracing out a fixed planar closed curve. This could result in a cylinder having a cross-section which is circular, elliptical, egg-shaped, or oval. The X and Y axes are orthogonal radii of the cylinder. Typically the RF shield is designed such that several coils, each which resemble a fingerprint, known as 'fingerprint' coils, are disposed on the outside surface of a cylindrical body, and several are disposed on the inside surface of the cylinder body. One set has 'fingerprint' coil centers which are perpendicular to an X axis through the cylinder, while the others are perpendicular to the Y axis. The magnetic flux created by these coils nulls out components of the stray fields oriented along their respective axes.

Conventional designs are constructed by disposing the coils on a flat surface and rolling such that the ends are connected. Due to the nature and geometry of the coil assembly used in shielding, half of each turn of a 'fingerprint' coil, "a half-loop", is disposed near either end of the flat surface. This requires that each half-loop to be electrically connected to its other corresponding half-loop to be functional. This requires soldering, and becomes very time consuming. The connection points of the half-loops typically are not as strong as other points, and the coils may break and fail at these locations as a result of stress placed on the coil.

Currently, there is a need for constructing coil assemblies which is less time-intensive, is simpler, and results in a coil assembly having increased life and reliability.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

SUMMARY OF THE INVENTION

A simplified, more resilient RF shield is constructed by applying complete 'fingerprint' coils on a substantially flat support with the centers of the 'fingerprint' coils spaced such that their centers are at predetermined locations when the support is rolled into a somewhat cylindrical shape. This will result in a predetermined amount of support overlap. This allows an integral number of complete 'fingerprint' coils to be used and not require soldering of half-loops of coils, as was common in the prior art methods.

The centers of the 'fingerprint' coils are located to coincide with a component of a magnetic field desired to be reduced or eliminated. Currents induced in the 'fingerprint' coils causes magnetic fields to be produced which have flux passing substantially through the center of each 'fingerprint' coil. This magnetic flux then interacts with components of an existing magnetic field, thereby reducing or eliminating the flux, and acting as a shield.

OBJECTS OF THE INVENTION

It is an object of the present invention to provide a coil assembly which is more resilient.

It is another object of the present invention to provide a coil assembly with increased reliability.

It is another object of the present invention to provide a simplified method of constructing coil assembly.

It is another object of the present invention to provide a coil assembly which is more easily manufactured.

DETAILED DESCRIPTION OF THE INVENTION

Figure 1:
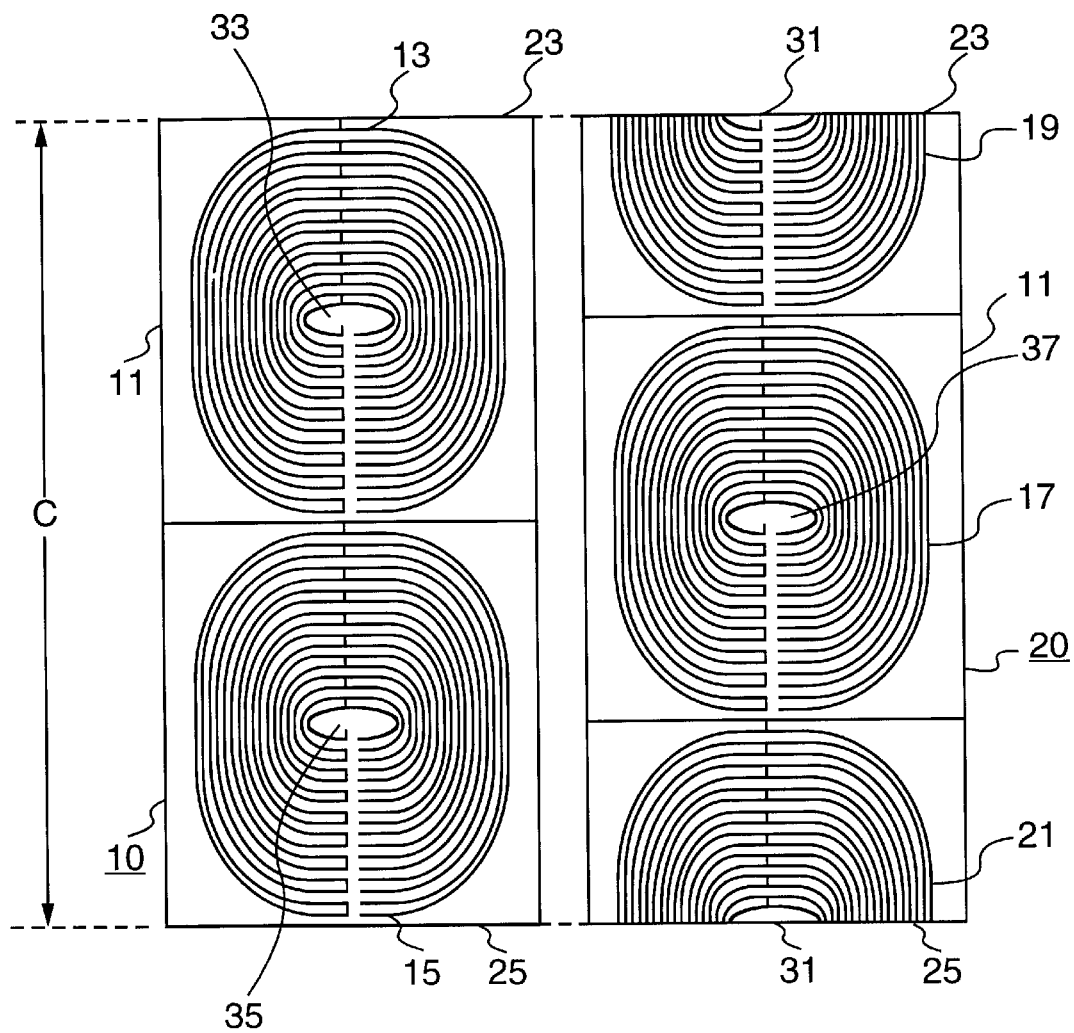
FIG. 1 is an illustration of several 'fingerprint' coils disposed on the inside and outside surface of a support intended to be rolled into a cylindrical shape according to conventional techniques.

FIG. 1 shows a prior art representation of several 'fingerprint' coils disposed on both the inside and outside surface of a cylindrical support. Fingerprint coils 13 and 15 are disposed on a support 11 having a length C which substantially corresponds to the circumference when support 11 is rolled into a cylindrical shape. Fingerprint coils 13 and 15 have centers 33 and 35, respectively. Magnetic fields induce currents in coils 13 and 15, respectively, causing the currents in the coils to create magnetic flux which pass substantially through centers 33, 35 of the coils, respectively.

Coils 13, 15 comprise the outer set of fingerprint coils to be disposed on the outer surface of support 11. Coils 17 and half coils 19, 21 will be disposed on the outer surface of support 11 such that when rolled edges 25 and 31 meet. Each half loop of half coil 19 is electrically connected to its corresponding half loop of coil 21 and such that a complete fingerprint coil is created from half coils 19 and 21. Electrical connection commonly is performed by soldering the half loops together, which may be come very tedious and time-consuming. This results in two complete fingerprint coils with centers 37 and 31 disposed on the outside of support 11.

Figure 2:
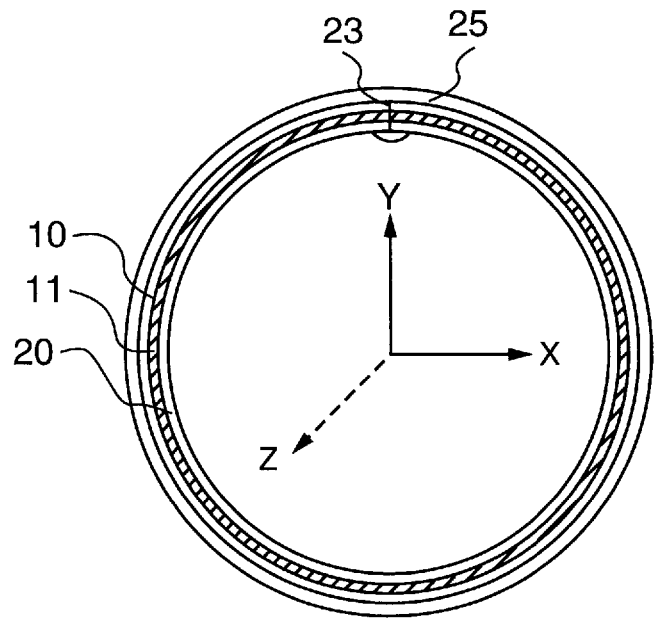
FIG. 2 is an illustration of the coils and support of FIG. 1 after being rolled into a cylindrical shape.

FIG. 2 shows support 11 which is rolled in the cylindrical shape such that edges 23 and 25 connect. On the outer surface is coil set 10 with coil set 20 on the inner surface. Centers 33 and 35 are on opposite sides of the cylinder formed when support 11 is rolled into a cylindrical shape. In order to reduce components of the RF fields in the X and Y directions, centers 33, 35 are positioned to substantially intersect the X axis whereas centers 31, 37 are positioned to substantially intersect the Y axis. The Z axis protrudes from outward from the plane of the paper as shown in FIG. 2. This causes magnetic flux components oriented in the X axis to be reduced or eliminated by coil set 10 and those having component oriented along the Y axis to be reduced or eliminated by coil set 20.

Figure 3:
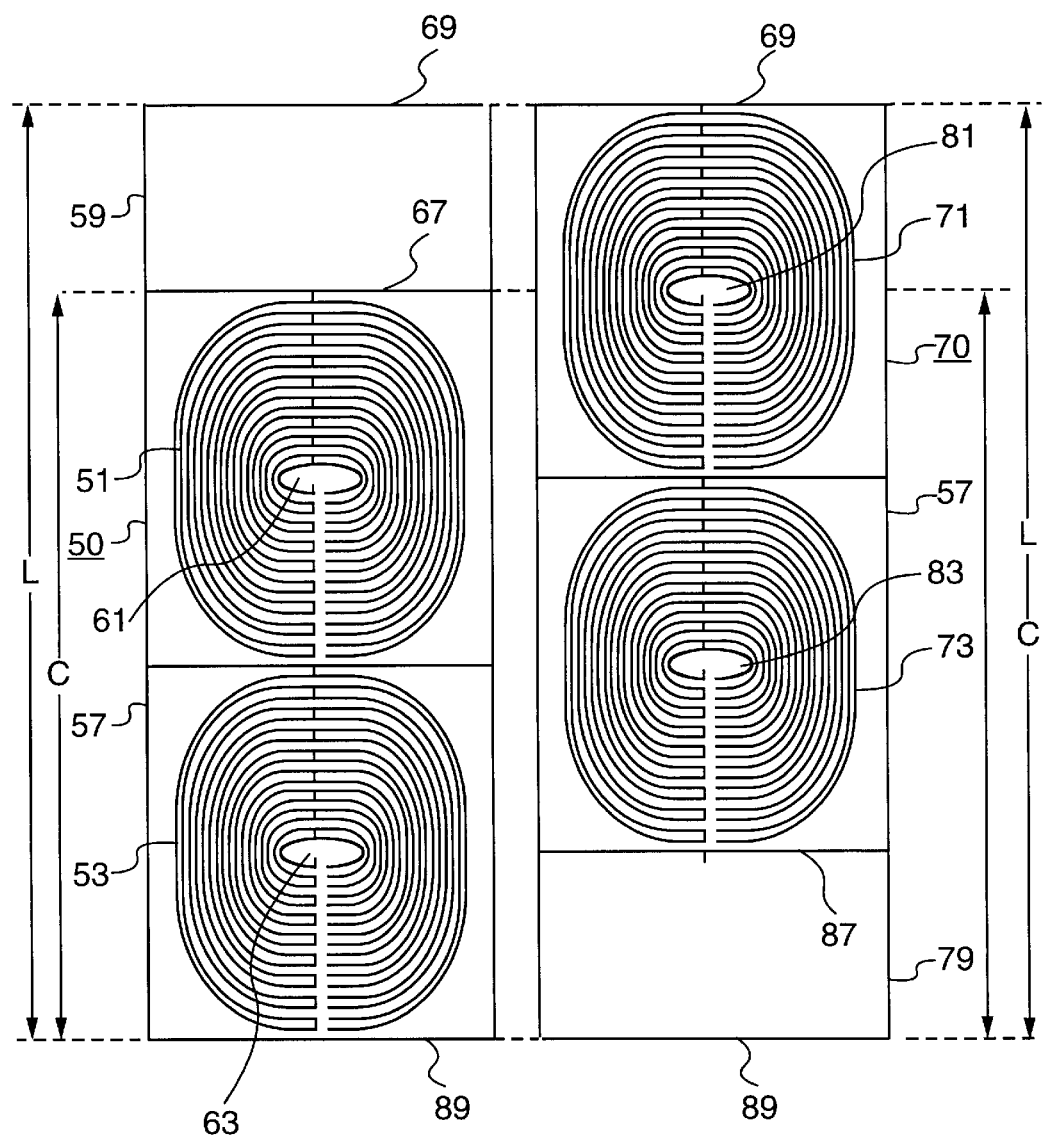
FIG. 3 shows one embodiment of coils attached to a support according to the present invention.

FIG. 3 shows one embodiment of the present invention applied to RF shielding coils. Complete fingerprint coils 51, 53 having centers 61, 63 are disposed on a support 57 having a length which is longer than the circumference C of cylinder formed when support 57 is rolled.

Similarly, fingerprint coils 71, 73 having centers 81, 83, respectively, are disposed on the other surface of the support 57. Please note that there is a section 59, 79 on each side of support 57 which there are no fingerprint coils. It should also be noted that coils 51 and 53 are approximately one half of the circumference ½ C away from each other. This allows flux to pass through each of the coils and also through the center of the cylinder formed. This is also true fingerprint coils 71, 73.

Figure 4:
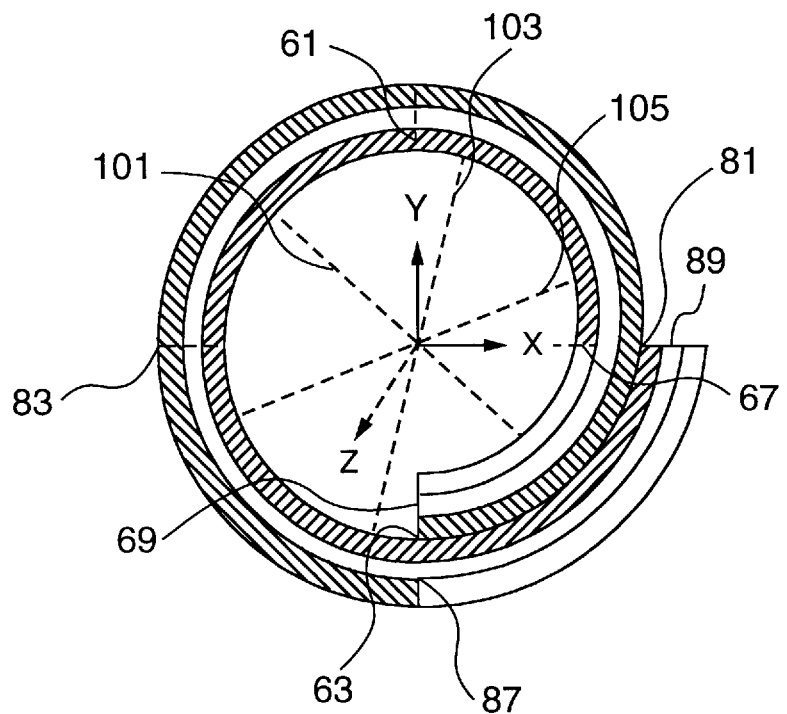
FIG. 4 is an illustration of the coils and support of FIG. 4 after being rolled into a cylindrical shape.

FIG. 4 shows support 57 rolled such that edge 89 meets point 67 and a section 59 between points 67 and 69, overlaps another portion of the cylinder. In this embodiment, centers 81 and 83 are approximately opposite each other and perpendicular to the X axis. Coil centers 61 and 63 are approximately opposite each other and perpendicular to the Y axis.

It should be noted that any integral number of fingerprint coil pairs may be used provided that they are arranged opposite each other across the cylinder formed and oriented relative to the components of the magnetic field desired to be eliminated or reduced.

In an alternative embodiment, three pairs of 'fingerprint' coils are employed, such that the length of the three coils are essentially ⅓C. They are offset by ⅙C between front to back coil sets. Each coil pair is substantially perpendicular to dashed lines 101, 103, 105 of FIG. 4 to reduce or eliminate magnetic field components oriented along those dashed lines.

While several presently preferred embodiments of the novel invention have been described in detail herein, many modifications and variations will now become apparent to those skilled in the art. It is, therefore, to be understood that the appended claims are intended to cover all such modifications and variations as fall within the true spirit of the invention.

What we claim is:

1. A method of constructing a substantially cylindrical coil having a circumference C comprising the steps of:
   a) creating a single continuous support having a length L greater than C;
   b) attaching a plurality of multi-loop 'fingerprint' coils each having a center, on a first surface of the support at predetermined locations relative to each other and the circumference C such that centers of the coils are substantially perpendicular to predetermined first set of axes through said cylindrical coil assembly when the support is rolled;
   c) rolling the support and coils into a cylindrical shape to result in a coil assembly in which the centers of the coils are substantially perpendicular to the predetermined first set of axes.

2. A method of constructing a substantially cylindrical coil coil having a circumference C comprising the steps of:
   a) creating a support having a length L greater than C;
   b) attaching a plurality of multi-loop 'fingerprint' coils each having a center, on a first surface of the support at predetermined locations relative to each other and the circumference C such that centers of the coils are substantially perpendicular to predetermined first set of axes through said cylindrical coil assembly when the support is rolled;
   c) rolling the support and coils into a cylindrical shape to result in a coil assembly in which the centers of the coils are substantially perpendicular to the predetermined first set of axes; and
   d) attaching a plurality of multi-loop 'fingerprint' coils each having a center, on a second surface of the support at predetermined locations relative to each other and the circumference C such that centers of the coils are substantially perpendicular to a predetermined second set of axes through said cylindrical coil assembly when the support is rolled.

3. A substantially cylindrical coil assembly having a circumference C comprising:
   a) a single continuous rolled support having a length L greater than circumference C, such that the support overlaps itself;
   b) an integral number of 'fingerprint' coils each having a center, positioned on a first surface of the single continuous support such that, when rolled, the centers of the coils are substantially perpendicular to a predetermined first set of axes.

4. A substantially cylindrical coil assembly having a circumference C comprising:
   a) a rolled support having a length L greater than circumference C, such that the support overlaps itself;
   b) an integral number of 'fingerprint' coils each having a center, positioned on a first surface of the support such that, when rolled, the centers of the coils are substantially perpendicular to a predetermined first set of axes; and
   c) an integral number of 'fingerprint' coils each having a center, positioned on a second surface of the support such that, when rolled, the centers of the coils are substantially perpendicular to a predetermined second set of axes.

5. A method of constructing a coil for minimizing stray RF energy, having a circumference C comprising the steps of:
   a) determining a plurality of axes through a region along which stray RF fields are to be minimized;
   b) selecting a single continuous support having a minimum length C which, when rolled, would substantially encompass the desired region;
   c) positioning a plurality of corresponding coil pairs on the single continuous support such that centers of the pairs would be substantially a distance ½ C away from each other, and when rolled, the corresponding coils will be positioned on substantially opposite sides of the cylinder, with an axis through the centers of coil pairs substantially aligning with the previously determined axes.

6. The method of constructing a coil of claim 5 further comprising the steps of:
   adding other coil pairs to the substrate such that centers of the pairs would be substantially a distance ½ C away from each other, and when the single continuous support and coils are rolled, the added coils will be positioned on substantially opposite sides of the cylinder as their corresponding coil, with an axis through the centers of added coil pairs substantially aligning with one of the previously determined axes.

* * * * *